（12） United States Patent
Gillingham

(10) Patent No.: US 8,966,208 B2
(45) Date of Patent: Feb. 24, 2015

(54) SEMICONDUCTOR MEMORY DEVICE WITH PLURAL MEMORY DIE AND CONTROLLER DIE

(75) Inventor: Peter Gillingham, Kanata (CA)

(73) Assignee: Conversant IP Management Inc., Ottawa, Ontario (CA)

( * ) Notice: Subject to any disclaimer, the term of this patent is extended or adjusted under 35 U.S.C. 154(b) by 792 days.

(21) Appl. No.: 12/967,918

(22) Filed: Dec. 14, 2010

(65) Prior Publication Data

US 2011/0208906 A1 Aug. 25, 2011

Related U.S. Application Data

(60) Provisional application No. 61/308,041, filed on Feb. 25, 2010.

(51) Int. Cl.
*G06F 12/00* (2006.01)
*G06F 1/32* (2006.01)

(52) U.S. Cl.
CPC ............ *G06F 1/3203* (2013.01); *G06F 1/3253* (2013.01); *G06F 1/3275* (2013.01); *G06F 1/3287* (2013.01); *Y02B 60/1225* (2013.01); *Y02B 60/1235* (2013.01); *Y02B 60/1278* (2013.01); *Y02B 60/1282* (2013.01)
USPC ................................ 711/167; 711/5; 711/105

(58) Field of Classification Search
USPC ......................................................... 711/167
See application file for complete search history.

(56) References Cited

U.S. PATENT DOCUMENTS

| | | | |
|---|---|---|---|
| 7,386,656 B2 | 6/2008 | Rajan et al. | |
| 7,515,453 B2 | 4/2009 | Rajan | |
| 2004/0148482 A1* | 7/2004 | Grundy et al. | 711/167 |
| 2006/0041730 A1* | 2/2006 | Larson | 711/167 |
| 2006/0155884 A1 | 7/2006 | Gomm | |
| 2007/0079049 A1* | 4/2007 | LaBerge | 711/5 |
| 2008/0170425 A1* | 7/2008 | Rajan | 365/63 |
| 2010/0091536 A1 | 4/2010 | Kim | |
| 2010/0159061 A1* | 6/2010 | Chen et al. | 425/547 |
| 2010/0198924 A1 | 8/2010 | Collet et al. | |

FOREIGN PATENT DOCUMENTS

| | | |
|---|---|---|
| CA | 2644593 | 10/2007 |
| JP | 07084863 | 3/1995 |
| JP | 11167515 | 6/1999 |
| WO | 2010002560 | 1/2010 |
| WO | PCT/CA2011/000144 | 5/2011 |

OTHER PUBLICATIONS

Robinson, Marc, "3D Packaging Interconnect for Mobile Internet", Vertical Circuits Inc., Wafer & Device Packaging and Interconnect, Jan./Feb. 2010, 4 pages.

* cited by examiner

*Primary Examiner* — April Y Blair
*Assistant Examiner* — Parasith Thammavong

(57) ABSTRACT

A semiconductor memory device including a plurality of memory die and a controller die. The controller die is connected to an internal control bus. The controller die is configured to provide to a selected one of the memory die an internal read command responsive to an external read command. The selected memory die is configured to provide read data to the controller in response to the internal read command; wherein latency between receipt by the controller die of the external read command and receipt of the read data from the selected memory die differs for at least two of the memory die when selected as the selected memory die.

35 Claims, 7 Drawing Sheets

SEMICONDUCTOR MEMORY DEVICE WITH PLURAL MEMORY DIE AND CONTROLLER DIE

CROSS-REFERENCE TO RELATED APPLICATION

The present application claims the benefit under 35 U.S.C. §119(e) of U.S. Provisional Patent Application Ser. No. 61/308,041, filed Feb. 25, 2010, hereby incorporated by reference herein.

TECHNICAL FIELD

The present invention relates generally to semiconductor memory devices and, in particular, to a semiconductor memory device having a plurality of memory die and a controller die.

BACKGROUND

Multi-Chip Packages (MCPs) integrating multiple stacked semiconductor chips (such as DRAM devices) in a single package achieve higher density than individual chips packaged within dedicated packages.

U.S. Pat. No. 7,515,453 to Rajan describes an interface chip packaged with two or more DRAM die in a single package. The interface chip can communicate with multiple DRAM die over a shared data bus so that only a single die can be accessed at any given time. Alternately, each of the DRAM die may have a dedicated data bus to the interface die so that the multiple interfaces can be operated in parallel to provide higher bandwidth.

U.S. Pat. No. 7,386,656 to Rajan et al. shows a variety of configurations for stacked DRAM die with a buffer chip in the same package. The external command bus (address, control, and clock) may be buffered by the interface chip and provided on a common internal bus to all DRAM die, or it may be provided on separate internal busses to each DRAM die, or it may be provided on separate internal busses each to several DRAM die. The external data bus may be bidirectionally buffered by the interface chip and provided on a common internal bus to all DRAM die, or it may be provided on separate internal busses to each DRAM die, or it may be provided on separate internal busses each to several DRAM die.

Unfortunately, these and other prior art MCP implementations suffer from various drawbacks, including high power consumption. This can be problematic, particularly for mobile devices where battery power is a limited resource. It would therefore be desirable in the industry if an MCP with reduced power consumption could be devised.

SUMMARY

According to a broad aspect, the present invention seeks to provide a semiconductor memory device, including: a plurality of memory die; a controller die connected to an internal control bus, the controller die being configured to provide to a selected one of the memory die an internal read command in response to an external read command; wherein the selected memory die is configured to return read data to the controller die in response to the internal read command; wherein latency between receipt by the controller die of the external read command and receipt by the controller die of the read data from the selected memory die differs for at least two of the memory die when selected as the selected memory die.

According to another aspect of the present invention, there is provided a multi-chip package including a plurality of semiconductor memory devices, each including: a plurality of memory die; a controller die connected to an internal control bus, the controller die being configured to provide a selected one of the memory die with an internal read command in response to an external read command; wherein the selected memory die is configured to provide read data to the controller die in response to the internal read command; wherein latency between receipt by the controller die of the external read command and receipt by the controller die of the read data from the selected memory die differs for at least two of the memory die when selected as the selected memory die.

For example, the controller die is further configured to output the received read data onto an external data bus, wherein latency between receipt by the controller die of the external read command and output of the read data onto the external data bus is uniform for said at least two of the memory die. The plurality of devices may be mounted on a circuit board with an interface. The multi-chip package may further comprise a register chip mounted on the circuit board, the register chip distributing the external control bus to each of the devices. The external data bus of each of the devices may be directly coupled to the interface, bypassing the register chip.

In accordance with another aspect of the present invention, there is provided a semiconductor memory device, including: a plurality of memory die; and a controller die connected to an internal control bus for providing to a selected one of the memory die a clock signal and a read command synchronized thereto. In the semiconductor memory device, the selected memory die is configured to output read data onto an internal data bus in response to receipt of the read command from the controller die. For example, the selected memory die is configured to source-synchronously output the read data onto the internal data bus. In order to source-synchronously output the read data, the selected memory die may be configured to output a strobe signal and a data signal representative of the read data. Advantageously, the data signal is synchronized with the strobe signal.

For example, the internal control bus is a dedicated internal control bus and the controller die is connected to each of the other memory die by a dedicated respective internal control bus.

The internal control bus may be a common control bus shared between the selected memory die and the memory die other than the selected memory die.

In accordance with one example, the selected memory die does not synchronize the read data output onto the internal data bus with the clock signal.

In accordance with another example, the selected memory die lacks circuitry configured for synchronizing the read data output onto the internal data bus with the clock signal.

In accordance with another example, the selected memory die includes circuitry configured for synchronizing the read data output onto the internal data bus with the clock signal, but where said circuitry is disabled.

In accordance with another example, the selected memory die is compliant with a JEDEC standard and configured in DLL-Off mode. For example, the JEDEC standard is JESD79-3C.

In accordance with another example, the selected memory die lacks circuitry configured for providing on-die termination of the internal data and control busses.

In accordance with another example, the selected memory die includes circuitry configured for providing on-die termination of the internal data and control busses, but where said circuitry is disabled.

In accordance with another aspect of the present invention, the controller die may be further configured to provide the internal read command in response to an external read command received on an external control bus.

In accordance with another aspect of the present invention, the plurality of memory die may be stacked. For example, each of the plurality of memory die is a dynamic random access memory (DRAM) die.

In accordance with another aspect of the present invention, there is provided a multi-chip package including a plurality of semiconductor memory devices. For example, the plurality of devices is mounted on a circuit board with an interface. The multi-chip package may further comprise a register chip mounted on the circuit board. The register chip may distribute the external control bus to each of the devices. The external data bus of each of the devices may be directly coupled to the interface, bypassing the register chip.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1:
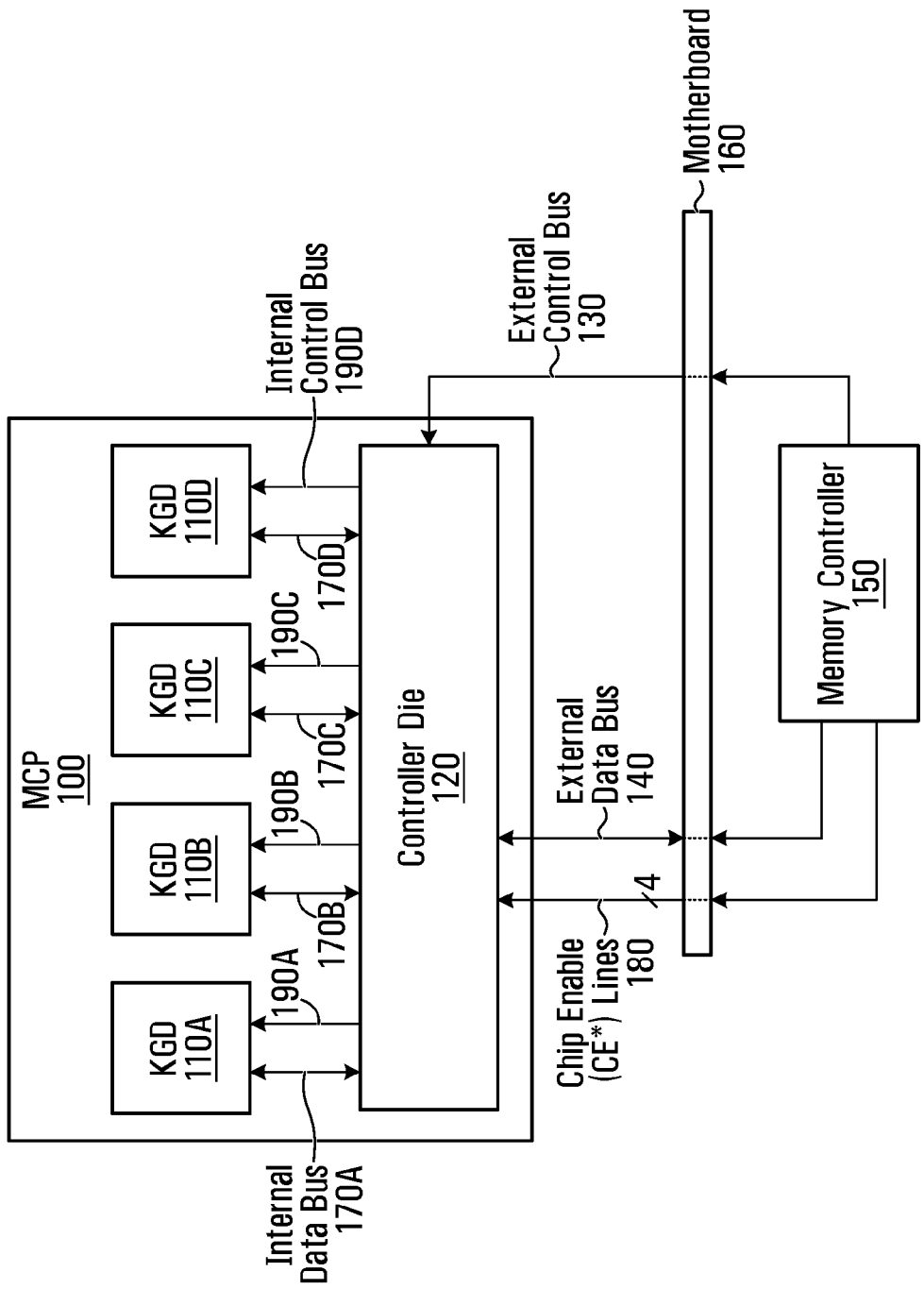
FIG. 1 is a block diagram of a multi-chip package (MCP) employing a controller die and multiple memory die, in accordance with a specific non-limiting embodiment of the present invention.

FIG. 1 shows a block diagram of a semiconductor memory device 100 including a plurality of memory die 110A, 110B, 110C and 110D, and a controller die 120. The semiconductor memory device 100 can be referred to as a multi-chip package (MCP). Each of the memory die 110A, 110B, 110C and 110D and the controller die 120 can be referred to as a "known good die" (KGD) indicating that it has been fully tested in wafer form before packaging in the MCP 100.

The memory die (KGDs) 110A, 110B, 110C and 110D can be dynamic random access memory (DRAM) devices (including synchronous DRAM—SDRAM) or other kinds of memory devices, particularly devices that are expected to have low latency for reading and writing. In this particular example, the number of memory die is four, but this is not to be considered limiting. In a specific non-limiting example embodiment, one or more of the memory die 110A, 110B, 110C and 110D may be DRAM devices conforming to JEDEC DDR3 standard JESD79-3C, hereby incorporated by reference herein. In some embodiments, different subsets of the memory die 110A, 110B, 110C and 110D may comply with different standards, which may or may not include the aforementioned JEDEC JESD79-3C standard.

The controller die 120 can be referred to as a "bridge chip", as it provides the memory die 110A, 1108, 110C and 110D with an interface to the outside world. Specifically, an external control bus 130 and an external data bus 140 connect a memory controller 150 to the MCP 100 by connecting to the controller die 120. The memory controller 150 and the MCP 100 may both be connected via a motherboard 160. Connections between the memory controller 150 and the MCP 100 may be direct or via a register and/or via one or more other MCPs. The controller die 120 can be configured to interact with the external control bus 130 and the external data bus 140 in accordance with a given standard (such as JEDEC DDR3) so that the MCP 100 is perceived as a standard-compliant device from the point of view of the memory controller 150.

The external control bus 130 carries a command/address signal and a global clock signal from the memory controller 150. The external data bus 140 includes external data lines that carry valid data when active and data strobe lines that carry data strobe signals. The data strobe signals are clock signals indicating when the external data lines are active and therefore carry valid data. Since data may originate from the memory controller 150 or from the MCP 100, the data strobe lines may be seized by the memory controller 150 or by the MCP 100, depending on whether write data is being transferred from the memory controller 150 to the MCP 100 or read data is being transferred from the MCP 100 to the memory controller 150.

The external control bus 130 providing the command/address signal and the global clock signal is buffered and provided to each memory die along an internal control bus. The command/address signal and the global clock signal can be transferred to the internal control bus with as little as one clock cycle latency. In the illustrated embodiment, separate dedicated internal control busses 190A, 190B, 190C and 190D are provided, one for each of the memory die 110A, 110B, 110C and 110D, respectively. Therefore, when a command from the memory controller 150 is addressed to a particular one of the memory die 110A, 1108, 110C and 110D and not the others, the controller die 120 determines the destination memory die for the command and activates only the internal control bus to the destination memory die, which saves power. Alternatively, it is possible to provide a single internal control bus that is shared by all the memory die 110A, 110B, 110C and 110D in parallel. This reduces the number of pads on the controller die 120 and the number of interconnections within the MCP 100 at the expense of increased power consumption.

The controller die 120 is also connected to the memory die 110A, 110B, 110C and 110D by respective internal data busses 170A, 170B, 170C and 170D. The internal data bus connecting the controller die 120 to a particular one of the memory die 110A, 1108, 110C and 110D includes internal data lines that carry valid data when active and data strobe lines that carry data strobe signals. The data strobe signals are clock signals indicating when the internal data lines are active and therefore carry valid data. Since data may originate from the controller die 120 or from a particular one of the memory die 110A, 110B, 110C and 110D, the data strobe lines may be seized by the controller die 120 or by the particular memory die, depending on whether write data is being transferred from the particular memory die to the controller die 120 or read data is being transferred from the controller die 120 to the particular memory die.

To improve performance, particularly at high frequencies, the controller die 120 can be configured to provide on-die termination (ODT) for the external interface (i.e., for the external data bus 140 and the external control bus 130). To this end, the controller die 120 can implement a variety of ODT options as described by, for example, the JEDEC DDR3 standard. One such option is to implement a split resistive termination to the power supply voltages VDDQ and VSSQ. Alternatively, to save power, one can employ a single resistive termination to a termination voltage regulated to an intermediate voltage between VDDQ and VSSQ, such as VTT=½(VDDQ−VSSQ). An example of the latter technique is described in U.S. Patent Application Publication No. 2010/0201397 assigned to the assignee of the present application entitled "Termination Circuit for On-Die Termination", hereby incorporated by reference herein. To this end, a linear VTT regulator may be employed for low cost and ease of integration on controller die 120, or an inductive regulator may be employed to provide higher power efficiency. In such a case, the VTT regulator may be integrated within the MCP 100. Alternatively, VTT could be provided to the MCP 100 through the motherboard 160 and a dedicated VTT pin or multiple VTT pins on the MCP.

It should be appreciated that the internal data busses 170A, 170B, 170C and 170D and the internal control bus (or busses 190A, 190B, 190C and 190D) do not require on-die termination because of the short interconnection distance from the controller die 120 to each memory die 110A, 110B, 110C and 110D, which distance remains relatively short even for the memory die furthest from the controller die 120 (within the same MCP 100). To this end, it is envisaged to implement the memory die 110A, 110B, 110C and 110D with either a total absence of on-die termination—which saves chip real estate—or with an ability to provide on-die termination that can be switched off, e.g., by extended mode register programming and/or by connecting the ODT pad to a power supply voltage as provided by the JEDEC DDR3 standard. In both cases, the absence (or disabling) of ODT results in less power consumption than if ODT were activated.

Knowing which of the internal data busses 170A, 170B, 170C and 170D to activate for a read or write operation requires the controller die 120 to identify a selected memory die, based on a command/address signal received via the external control bus 130. Various possible implementations can allow a selected memory die to be identified by the controller die 120. To illustrate some of these implementations, let it be assumed for simplicity that the size of each of the four (4) memory die 110A, 110B, 110C and 110D is identical and equals to 2" addressable words, i.e., amenable to representation by N address bits. The capacity of the MCP 100 is therefore actually $2^{N+2}$ words, which is amenable to representation by (N+2 bits).

In one possible implementation, illustrated in FIG. 1, the memory controller 150 interacts with the MCP 100 as if it were a 4-rank DRAM device, requiring selection of a rank (in reality, selection of a memory die) in addition to identification of a desired address within the selected memory die. To this end, the selected memory die is identified by the memory controller 150 using four (4) chip enable (CE*) lines 180 provided directly to the controller die 120. The command/address signal received by the controller die 120 along the external control bus 130 encodes the N bits needed to identify an address within the address space of the selected memory die.

In another possible implementation, the memory controller interacts with the MCP as if it were a 2-rank DRAM device, requiring selection of a rank in addition to identification of a desired address within the address space of that rank. To this end, the selected rank is identified by the memory controller using two (2) chip enable (CE*) lines provided directly to the controller die, while the command/address signal received by the controller die along the external control bus includes one (1) extra bit to identify selected memory die. The remaining N address bits identify an address within the address space of the selected memory die.

In yet another possible implementation, the memory controller interacts with the MCP as if it were a DRAM device having four (4) times the number of banks, rows or columns. To this end, a selected memory die is identified implicitly by the memory controller using two (2) additional address bits forming part of the address encoded by the command/address signal on the external control bus. The remaining N address bits identify an address within the address space of the implicitly selected memory die.

Those skilled in the art will appreciate that the internal and external data busses need not be of the same width (number of pins), overall speed or per-pin speed. Specifically, it is envisaged that the bandwidth needs of the external data bus can be satisfied using a variety of different configurations, some of which are now illustrated.

Figure 2A:
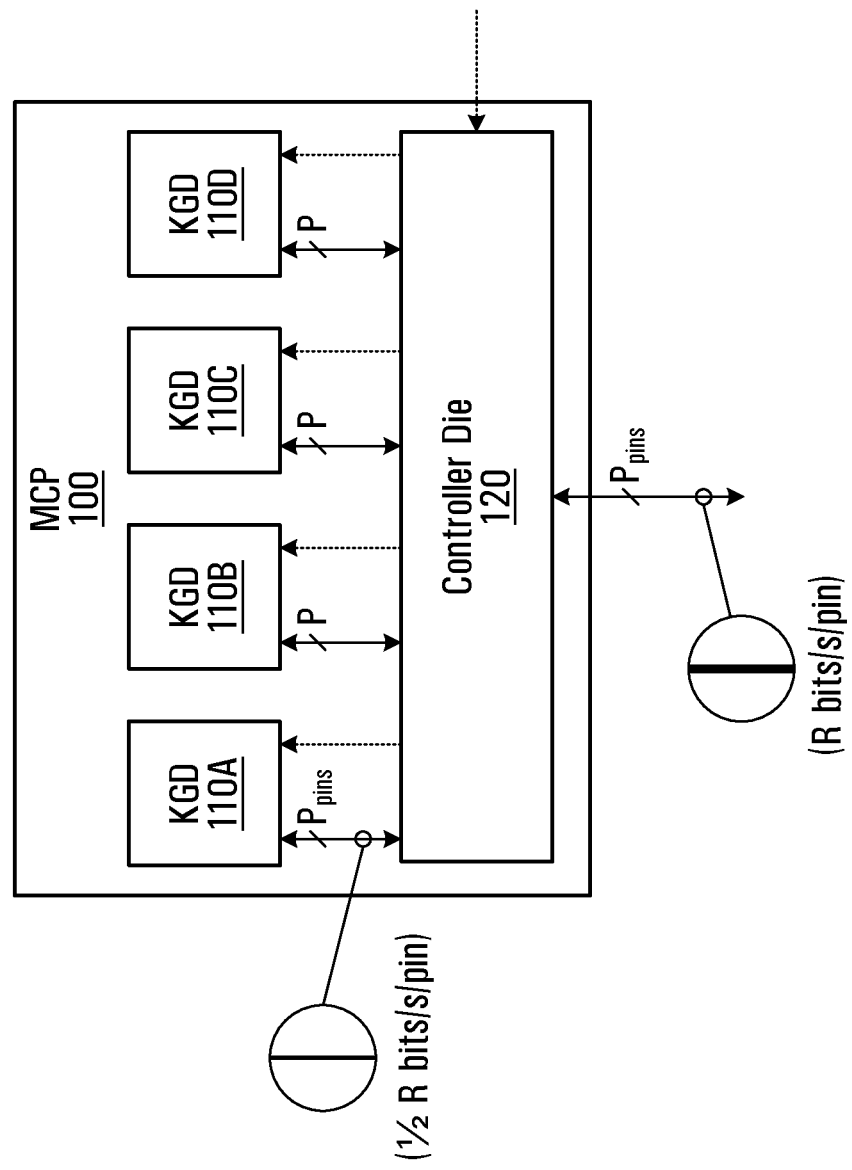
FIGS. 2A and 2B are block diagrams illustrating different possible configurations of the MCP in terms of bus and pin capacity.

For example, consider that the external data bus 140 is P conductors wide and has a per-pin capacity of R (bits per second per pin). This results in a total capacity of P×R (bits per second) on the external data bus 140. If each of the internal data busses 170A, 170B, 170C and 170D is assumed to be identical and if each such internal data bus has the same width P but a per-pin capacity of ½R (bits per second per pin), then the situation of FIG. 2A is applicable. Specifically, two (2) of the memory die 110A, 110B, 110C and 110D should be activated at the same time so that the aggregate overall bandwidth of the internal data busses corresponding to the activated memory die amounts to P×R, i.e., the overall capacity of the external data bus.

Figure 2B:
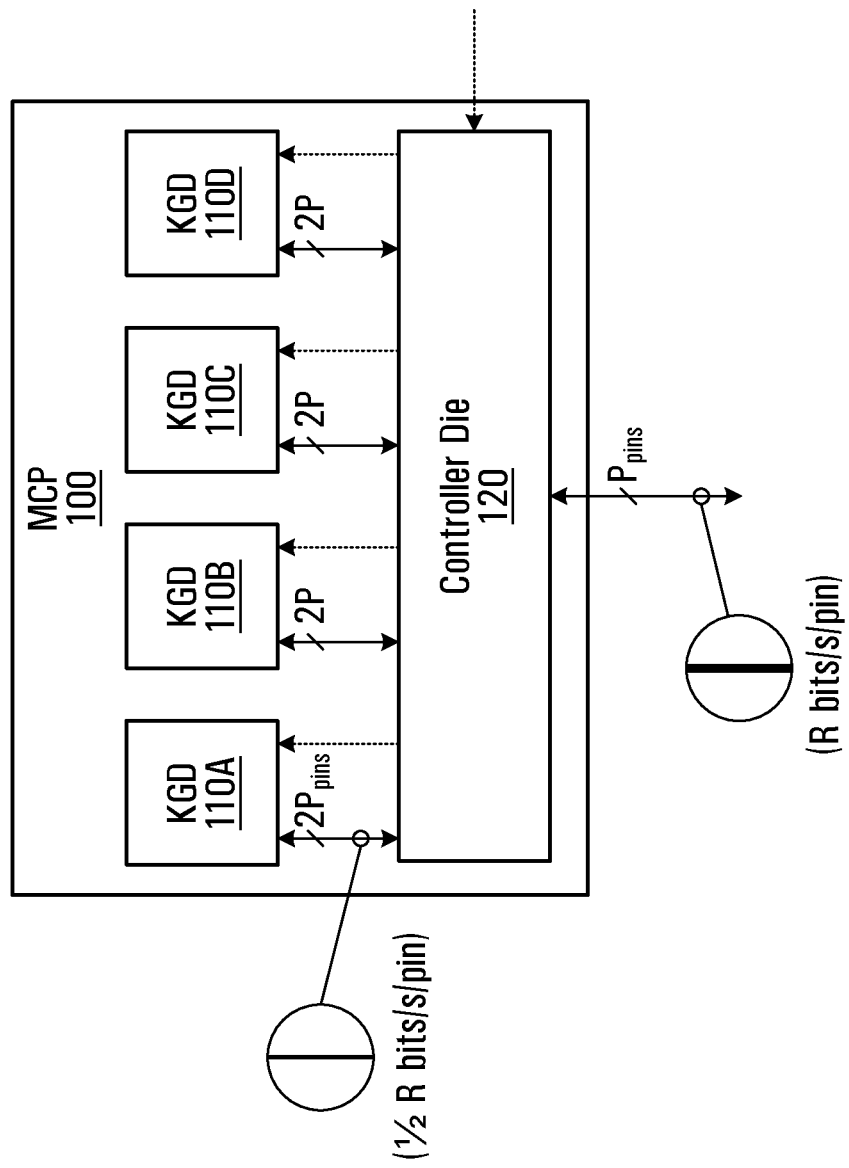

On the other hand, if each of the internal data busses 170A, 170B, 170C and 170D has a per-pin capacity of ½R (bits per pin per second) but now is doubled in width (i.e., 2P conductors), then the situation of FIG. 2B is applicable. Specifically, the bandwidth of each of the internal data busses 170A, 170B, 170C and 170D is P×R, which matches the capacity of the external data bus 140. Thus, only a single memory die should be activated in order to satisfy the demands of the external data bus 140.

Clearly, it should be appreciated that the use of the controller die 120 provides flexibility in terms of being able to accommodate a wide range of memory die and internal data bus design options to achieve system requirements.

It should be noted from the above examples that during the time that the memory controller 150 writes/reads data to/from a particular one of the memory die 110A, 110B, 110C and 110D along the respective internal data bus 170A, 170B, 170C and 170D, one or more of the other internal data busses 170A, 170B, 170C and 170D can be kept idle. This allows a reduction in the amount of power consumed by the totality of the internal data busses 170A, 170B, 170C and 170D and the memory die 110A, 110B, 110C and 110D connected to the controller die 120.

Figure 3:
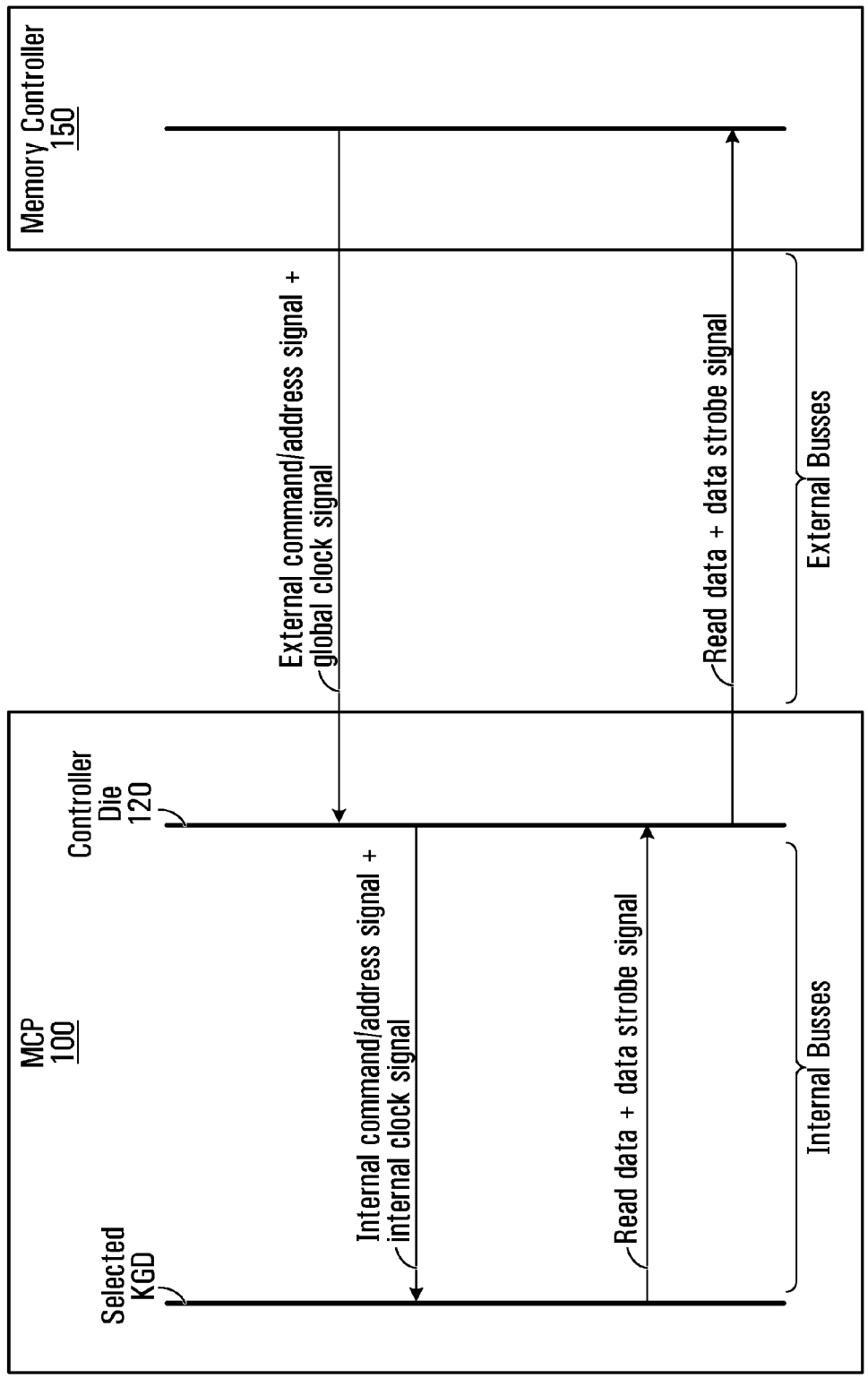
FIG. 3 is a signal flow diagram illustrating possible interaction between various system components during a read operation.

With reference now to the signal flow diagram in FIG. 3, the following outlines an example of the basic signaling that can used by the controller die 120 and the memory die 110A, 110B, 110C and 110D in the context of a read operation. Firstly, the controller die 120 receives a global clock signal and an external command/address signal synchronized therewith on the external control bus 130. The external command/address signal includes a first portion that encodes a read command specifying that a read operation is to take place and preparing the controller die 120 for receipt of an address. A second portion of the external command/address signal encodes an address from which data is to be read. The address is either sufficiently complete to allow the controller die 120 to identify a selected memory die, or this information is obtained from additional signals such as one of the chip enable lines 180. In any event, the controller die 120 identifies a selected memory die. The remaining portion of the address specifies a read address within the address space of the selected memory die.

Having identified the selected memory die, the controller die 120 sends an internal command/address signal to the selected memory die along the internal control bus (which, depending on the configuration, can be a shared bus or a dedicated bus). More specifically, the controller die 120 synchronizes the internal command/address signal with an internal clock signal and both are sent to the selected memory die along the internal control bus. A master DLL (not shown) may be provided in the controller die 120 to reference the internal clock signal to the global clock signal. The internal command/address signal includes a first portion that encodes a read command specifying that a read operation is to take place and preparing the selected memory die for receipt of an address. A second portion of the internal command/address signal encodes the aforementioned read address within the address space of the selected memory die.

The selected memory die receives the internal command/address signal and the internal clock signal along the internal control bus. It is recalled that the internal command/address signal is synchronized with the internal clock signal. The selected memory die relies on its internal circuitry to retrieve the data from the memory location at the read address, and places this "read data" onto its internal data bus. The selected memory die also controls generation of the data strobe signal, which is enabled when the internal data lines carry valid data. Thus, the internal data lines carry a source synchronous data signal. When the selected memory die seizes control of its internal data bus, the data placed on the data lines is not required to be synchronized with the internal clock signal that is received by the selected memory die via the internal control bus. Dedicated internal data busses 170A, 170B, 170C and 170D eliminate the possibility of a read data burst from one memory die interfering with a read data burst from another memory die (which could occur if multiple memory die sharing a common internal data bus were sequentially activated).

The read data received from the selected memory die on the respective internal data bus is captured by the controller die 120 and re-synchronized for transmission on the external data bus 140. Proper capture of the read data is enabled by using a clock that is phase shifted by 90 degrees relative to the data strobe signal received together with the read data on the internal data bus. To this end, the controller die 120 includes a slave DLL whose frequency is tied to that of a master DLL referenced to the global clock signal. The slave DLL is triggered by the rising edge of the data strobe signal and thereafter produces a clock signal that is precisely 90 degrees out of phase with the data strobe signal and at the same frequency of the received data strobe signal.

The controller die 120 may read data from several different selected memory die in the manner described above. Thus, a slave DLL is provided for each of the memory die 110A, 110B, 110C and 110D. A buffer (e.g., a FIFO, not shown) within the controller die 120 can hold the data until it is time to provide it on the external data bus 140. Resynchronization is achieved using the aforementioned master DLL. This provides precise latency control in the case of a read operation, as it allows the controller die 120 to ensure that any read data output onto the external data bus 140 will follow receipt of a read command after a deterministic number of clock cycles. This will be explained in greater detail later on. The controller die 120 also controls generation of the external data strobe signal, which is activated when the external data lines carry valid data.

It will be noted that because there is no need for the selected memory die to align its read data with any received clock signal, the selected memory die does not require a synchronization circuit (e.g., a DLL) referenced to the internal clock signal or any other clock signal. This means that such a circuit can either be disabled (which leads to power savings), or omitted altogether (which additionally leads to chip real estate savings). The ability to disable an existing synchronization circuit may be provided by programming the memory die 110A, 110B, 110C and 110D to operate in a "DLL-Off" mode as defined in standard DDR2 or DDR3 DRAM devices meeting the JEDEC specification.

Those skilled in the art should thus appreciate that the cost of the MCP can be kept low by omitting from the memory die the DLL and ODT circuit blocks found in standard DRAM devices. These circuit blocks are not required for point-to-point information transfer over a dedicated internal bus. In addition, the output driver size may be reduced since only a light load is encountered within the MCP environment.

The use of the controller die 120 introduces some latency into the read operation, since it takes the selected memory die at least one additional clock cycle before it knows the identity of the read address. However, any penalty arising from such additional delay is offset by the benefits of reduced capacitive loading, reduced power consumption (due to the ability to deactivate one or several inactive busses, and to deactivate ODT and DLL circuits) and reduced cost/die size of the DRAM devices.

Figure 4:
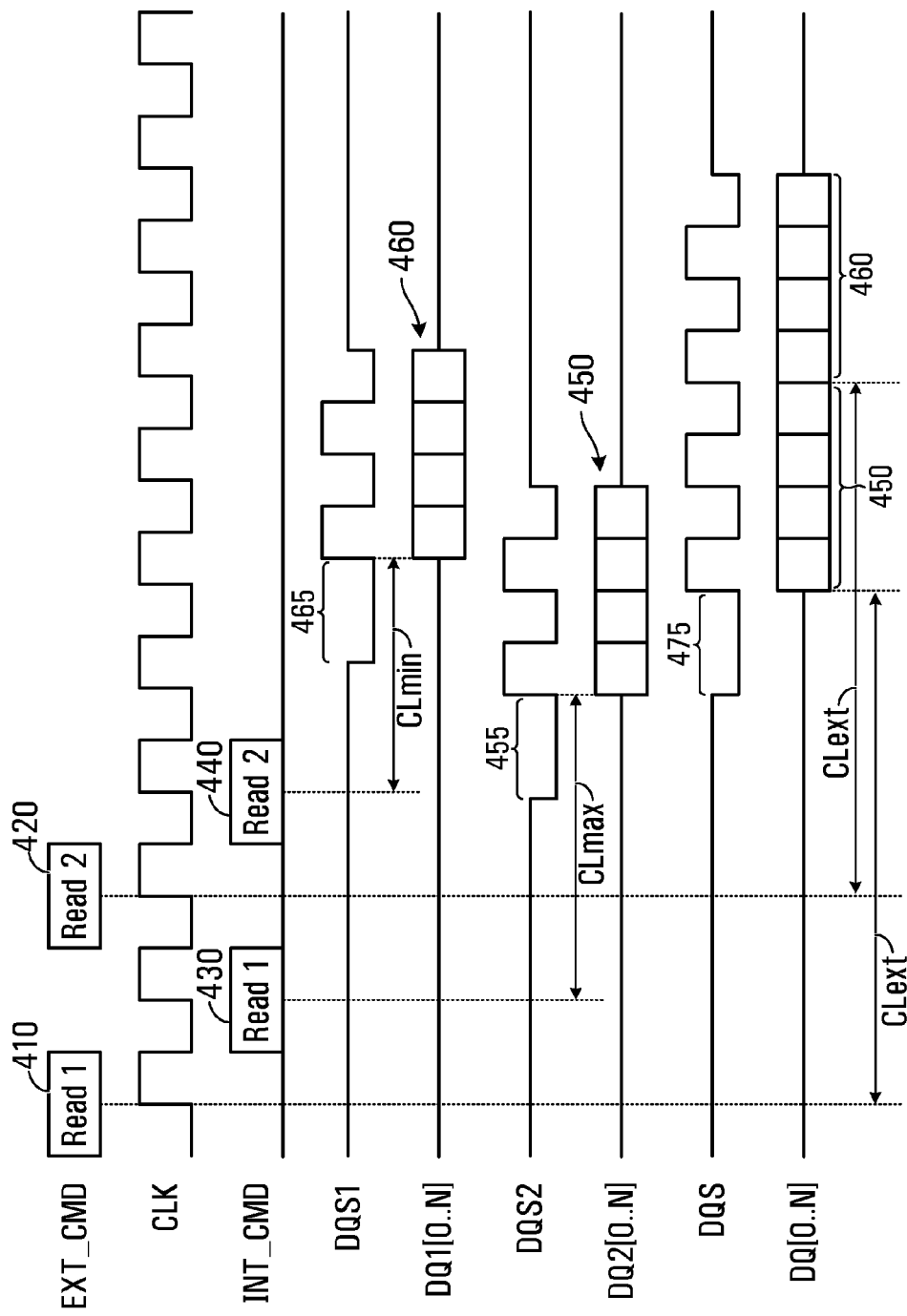
FIG. 4 is a timing diagram showing resynchronization of read data received from the memory die by the controller die in the case where the memory die do not clock their read output to a global clock signal.

Reference is now made to FIG. 4, a timing diagram illustrative of two successive read operations, showing signals at controller die 120. CLK represents the global clock signal received from the memory controller over the external control bus 130. CLK may also represent the internal clock signals distributed to the memory die 110A, 110B, 110C and 110D over a shared internal control bus for the case where the master DLL is used to align the internal clock to the global clock. If the master DLL is not used for this purpose, there could be a phase shift between the internal clock signals and the global clock signal.

EXT_CMD represents the external command/address signal, which is provided on the external control bus 130 in synchronicity with CLK (in this case, aligned to its falling edge). EXT_CMD includes a first external read command 410 and a second external read command 420 for processing by the controller die 120. The memory die targeted by a particular read command is determined based on the external command/address signal. For the sake of the present example, it is assumed that the memory die targeted by the first external read command 410 is memory die 110B and that the memory die targeted by the second external read command is memory die 110A. Accordingly, each external read command results in a corresponding internal read command destined for the selected memory die. Specifically, INT_CMD represents the internal command/address signal, which is provided on the (shared) internal control bus in synchronicity with the internal clock (in this case, both INT_CMD and the internal clock are synchronized with CLK using the master DLL so there is no uncontrolled phase shift, only a one clock cycle delay latency). INT_CMD includes a first internal read command 430 (which follows the first external read command 410 by a complete clock cycle) and a second internal read command 440 (which follows the second external read command 420, also by a complete clock cycle). Only a single INT_CMD signal is shown. This represents the case where all memory die are connected to a shared internal control bus. In the case of separate internal control busses there would be multiple internal control busses (e.g., INT_CMD1, INT_CMD2 etc.), and the individual internal read commands 430, 440 would appear on a respective internal control bus associated with the addressed memory device.

The first internal read command 430 is processed by memory die 110A, which retrieves first read data 450 from the memory location at the required address. Memory die 110B source-synchronously outputs the first read data 450 onto the internal data lines of internal data bus 170B. That is, when read data is provided on the internal data lines, memory die 110B also activates the data strobe signal. This may be preceded by a preamble (lasting, e.g., one full clock cycle) during which the data strobe signal is kept to a low logic level. DQ2[0 ... N] represents the data on internal data bus 170B, which provides the first read data 450, while DQS2 represents the data strobe signal. It is noted that DQS2 exhibits a full clock cycle preamble 455 at a low logic level.

In much the same way, the second internal read command 440 is processed by memory die 110A, which retrieves second read data 460 from the memory location at the required address. Memory die 110A outputs the second read data 460 onto the internal data lines of internal data bus 170A in a source synchronous manner. That is, when read data is provided on the internal data lines, memory die 110A also activates the data strobe signal. This may be preceded by a preamble (lasting, e.g., one full clock cycle) during which the data strobe signal is kept to a low logic level. DQ1[0 ... N] represents the data on internal data bus 170A, which provides the second read data 460, while DQS1 represents the data strobe signal. It is noted that DQS1 exhibits a full clock cycle preamble 465 at a low logic level.

It is recalled that memory die 110A and memory die 110B might not be equipped with circuitry to recover CLK or such circuitry may be disabled. As a result, memory die 110A and memory die 110B output their data with an arbitrary phase with respect to CLK. For example, this will be the case when memory die 110A and memory die 110B output their data asynchronously. This will cause variations in "CAS latency" (or "CL") between different memory die. In particular, the latency between issuance of the first internal read command 430 by the controller die 120 and the appearance of the first read data 450 on the internal data lines of internal data bus 170B may be different from the latency between issuance of the second internal read command 440 by the controller die 120 and the appearance of the second 460 read data on the internal data lines of internal data bus 170A. In fact, the CAS latency CLn (for memory die 110n) may vary anywhere within a range of latencies from CLmin to CLmax, which may span more than one clock period. Factors that may influence the CAS latency in a particular instance of an internal read command include manufacturing variations, distance between the selected memory die and the controller die 120, and local temperature gradients, to name a few possibilities.

As shown in FIG. 4, which assumes a DDR (double data rate) mode of operation, the first read data 450 provided by memory die 110B includes a burst of four (4) data words at the maximum CAS latency CLmax, which is equivalent to three full clock cycles, while the second read data 460 provided by memory die 110A includes a burst of four (4) data words at the minimum CAS latency CLmin, which is slightly more than two full clock cycles in this example.

The controller die 120 receives the read data 450, 460 on the two internal data busses 170B, 170A. Specifically, in DDR mode, the controller die 120 samples the first read data 450 (second read data 460) on both the rising and falling edges of the received data strobe signal DQS2 (DQS1) delayed by 90° through the respective slave DLL. Some initial training may be required to determine the appropriate internal timing to enable each of the slave DLLs during the preamble. It is noted that the controller die 120 expects read data to arrive from any selected memory die no earlier than CLmin and no later than CLmax after issuing an internal read command to that memory die.

The buffer within the controller die 120 can hold the first and second read data 450, 460 until it is time to provide it onto the external data lines of the external data bus 140, namely at a time instant that represents a deterministic latency relative to receipt of the first or second external read command 410, 420 from the memory controller 150. DQ[0 ... N] represents the data on the external data bus 140, which includes the first read data 450 immediately followed by the second read data 460.

The controller die 120 outputs the first and second read data 450, 460 onto the external data bus 140 in a source synchronous manner. That is, the controller die 120 enables the data strobe signal (represented in FIG. 4 by DQS) to signal the presence of valid data on the external data lines of the external data bus 140. This may be preceded by a preamble (lasting, e.g., one full clock cycle) during which DQS is kept to a low logic level. It is noted that DQS exhibits a full clock cycle preamble 475 at a low logic level; however, it only needs to be lowered once (namely, before outputting the first read data 450).

Thus, data received on internal data bus 170n (for memory die 110n) with CAS latency CLn is delayed by another ((CLmax−CLn)+1) clock cycle(s) before appearing on the external data bus 140.

Therefore, the total overall latency CLext between receipt of by the controller die of an external read command (e.g., 410, 420) via the external control bus 130 and output of the data (e.g., 450, 460) onto the external data bus 140 can be expressed as follows:

| | |
|---|---|
| From external read command to internal read command: | 1 |
| From internal read command to receipt of read data: | +CLn |
| Equalizing delay added by controller: | +((CLmax−CLn) + 1) |
| Total overall latency CLext | 5 clock cycles |

It will thus be seen that the total overall latency CLext is uniform, and is independent of CLn. Therefore, the overall latency from the point of view of the memory controller 150 can be kept the same, even though the individual memory die 110A, 110B, 110C and 110D may have different CAS latencies (due to various factors, notably disabled or lacking synchronization circuitry). Thus, it will be appreciated that the MCP 100 provides deterministic latency relative to an external read command without requiring DLLs on each of the memory die 110A, 110B, 110C and 110D. Specifically, it will be noted that the total overall latency between issuance of the first external read command 410 by the memory controller 150 and the appearance of the first read data 450 on the external data bus 140 is identical to the total overall latency between issuance of the second external read command 420 by the memory controller 150 and the appearance of the second read data 460 on the external data bus 140. Therefore, the total overall latency can be kept uniform.

In the above example, it was assumed that CLmax was equal to precisely three (3) clock cycles. Of course, CLmax may be different in a particular implementation and may not even be a whole number of clock cycles. In such a case, the above calculation may be changed to account for the difference between CLmax and the next largest whole number. Alternatively, CLmax could be adjusted to the next highest half clock cycle to realize CLmax of 3.5 or 4.5. However, in either case, the resulting value of CLext will still be independent of CLn.

It is noted that the use of separate internal data busses 170A, 170B, 170C and 170D overcomes a variety of problems. Firstly, if both memory die 110A and memory die 110B shared a common internal data bus, and if two internal read commands were issued in succession as described above, then the end of the burst from memory die 110A would conflict with the beginning of the burst from memory die 110B. Moreover, because the data strobe signal which accompanies a given burst has a longer duration than the burst itself (due to a full clock period preamble having a low logic level), it would not be possible to line up the bursts in a back to back (gapless) fashion with a common internal data bus, which would have the effect of reducing the usable capacity of such common internal data bus. However, these problems do not arise in the embodiments of the MCP 100 described herein because each memory die has its own internal data bus. Moreover, in the embodiments of the MCP 100 described herein, bursts of data from individual memory die—which may overlap, be contiguous or separated by a time gap—are concatenated to create longer gapless bursts for improved bus utilization.

Figure 5:
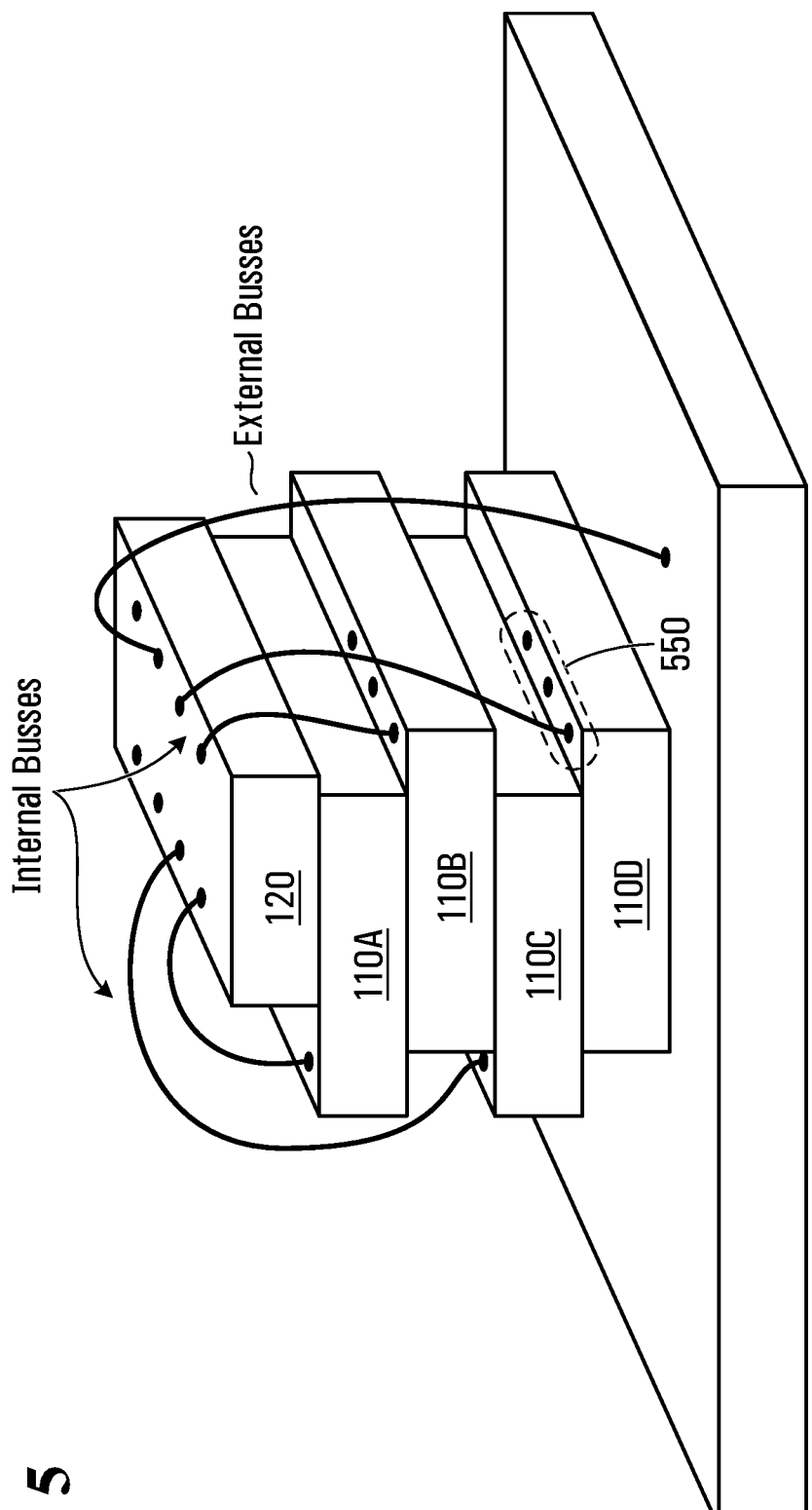
FIG. 5 shows an example of physical configuration for stacking the memory die and the controller die to make an MCP.

From a physical standpoint, and as shown in FIG. 5, the controller die 120 and the memory die 110A, 110B, 110C and 110D can be stacked onto one another within the MCP 100. The controller die 120 can be smaller than any of the memory die 110A, 110B, 110C and 110D and can therefore be placed on top of the memory die 110A, 110B, 110C and 110D, which themselves can be stacked onto a package substrate. Wire bonds from both the memory die 110A, 110B, 110C and 110D and the controller die 120 can make a connection down to the package substrate to make both external connections and inter-die connections. In one embodiment, as shown in FIG. 5, a custom memory die can be constructed with bonding pads 550 along the edge of the memory die, which can facilitate die stacking. While memory die with bonding pads on both sides of the chip are possible, a more advantageous memory die may be one with bonding pads on only one side of the chip. This allows the die to be stacked and staggered to expose the bonding pads on all of the die in the stack, thereby facilitating direct wire bonding to the package substrate without the requirement for interposers.

In some configurations, there may be rows of MCPs located on the front (and possibly back) sides of a printed circuit board. This can be referred to as a Dual In-line Memory module (DIMM). DIMM modules are commonly used in PCs where memory can be upgraded by the user by adding or replacing modules plugged into motherboard sockets. DIMM modules compliant with JEDEC DDR3 standard JESD-793C have a total of 250 pins and provide a 64 bit or 72 bit data interface.

Figure 6:
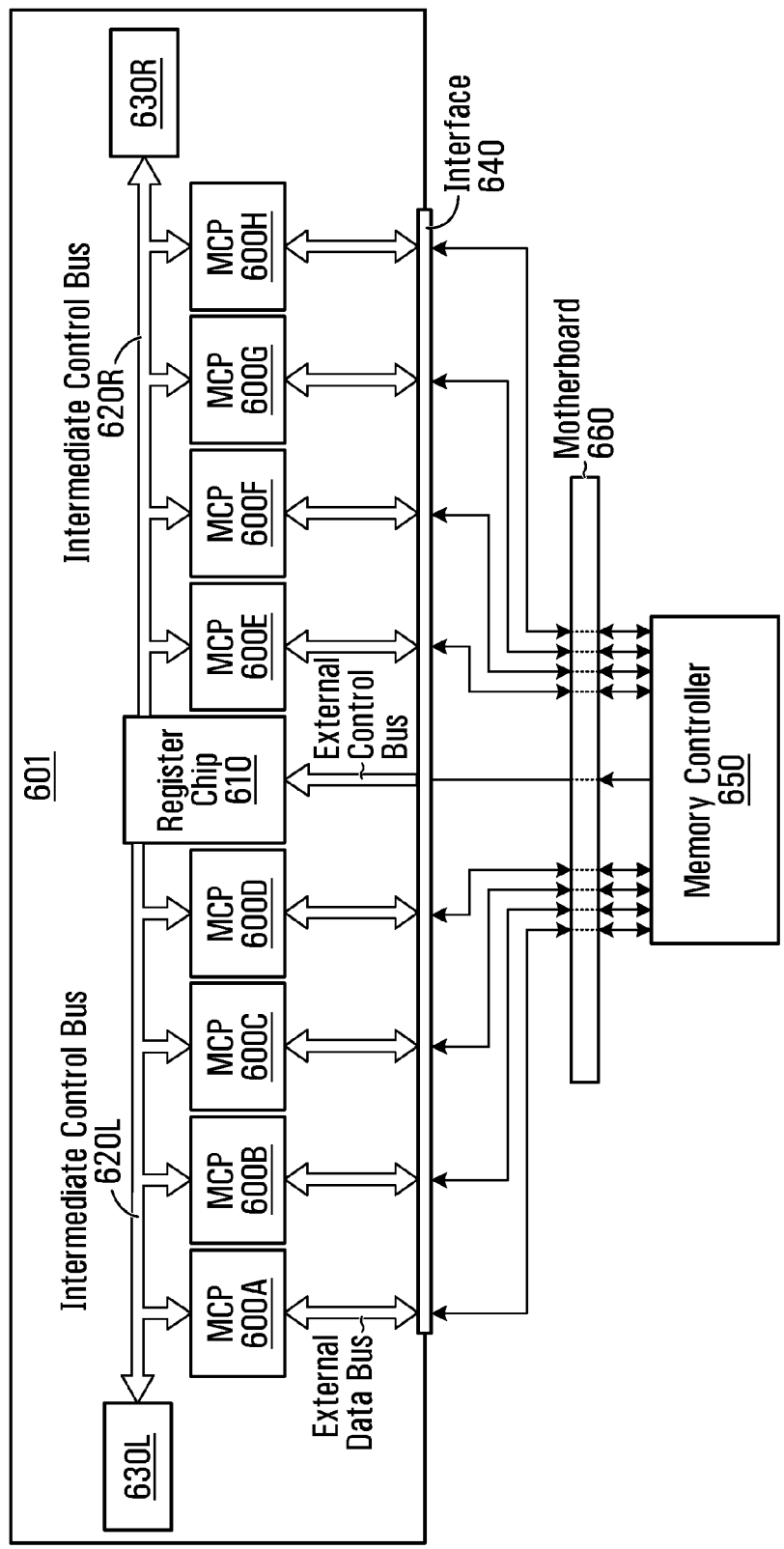
FIG. 6 is a diagram of a multi-rank MCP RDIMM, in accordance with a specific non-limiting embodiment of the present invention.

In other configurations, multiple MCPs may be "registered". Specifically, FIG. 6 shows a multi-rank MCP Registered DIMM (RDIMM) system employing an MCP RDIMM 601 with a plurality of MCPs 600A, 600B, 600C, 600D, 600E, 600F, 600G and 600H mounted on a circuit board. In the illustrated example, the number of MCPs is eight (8), although this is not a limitation of the present invention. The MCP RDIMM 601 has an interface 640 that can be connected to a memory controller 650 via a motherboard 660. In a typical PC, several DIMM sockets mounted on the motherboard facilitate system upgrades.

In addition, the MCP RDIMM 601 includes a discrete register chip 610 mounted on the circuit board. The register chip 610 is configured to buffer the external command/address signal and the global clock signal, received via the interface 640, for distribution to MCPs 600A, 600B, . . . , 600H. Specifically, there are two (2) separate intermediate control busses, one (620L) providing command/address and clock signals to the four (4) MCPs on the left (MCPs 600A, 600B, 600C, 600D), and another (620R) providing command/address and clock signals to the four (4) MCPs devices on the right (MCPs 600E, 600F, 600G, 600H). A termination resistor network 630L, 630R is placed at the end of each intermediate control bus 620L, 620R, to remove reflections and maintain signal integrity. Depending on the speed of operation and module board design considerations, there may be fewer intermediate control busses or more intermediate control busses than the number shown.

The register chip 610 may detect which set of MCPs (i.e., left or right) is being accessed, based on chip enable (CE*) lines or address bits, and only drive the required intermediate control bus (i.e., 620L or 620R). In a standard PC DIMM, all external data busses are activated and therefore both left and right control busses must be activated.

Each MCP's external data bus is connected directly to the memory controller 650 via the interface 640 without passing through the register chip 610. Specifically, with ×8 MCPs (i.e., having an external data bus that is 8 bits in width), the external data busses can be connected in byte groupings to achieve ×64 module data width. Other groupings such as nibble grouping are possible using ×4 DRAM devices. DIMM modules supporting parity with ×72 module data width are also possible, using, for example, a total of nine (9) byte-wide MCPs.

Each of the MCPs 600A, 600B, . . . , 600H includes a stack of memory die and a controller die as described above. Within a given MCP, the controller die further buffers the external command/address signal and global clock signal received via the register chip 610. The external data bus for a given MCP is connected directly between the memory controller 650 and the controller die of the given MCP, bypassing the register chip 610.

The register chip 610 includes a delay locked loop (DLL) to generate internal clocks to capture and regenerate the command/address and internal clock signals. Inputs are latched (or registered) using an input sampling clock and the latched signals are clocked out using an output driving clock. Typically, the output driving clock is automatically adjusted to provide one (1) clock cycle of delay from input to output through the register chip 610.

The effect of the register chip 610 and each MCP's controller die 120 on latency is as follows: Firstly, the register chip 610 adds one (1) clock cycle latency to the command stream, whereas the controller die 120 adds an additional one (1) clock cycle latency to the command stream. For the data path, the controller die 120 adds one (1) clock latency to read data provided by the selected memory die to the external data bus and one (1) clock cycle latency to write data coming from the external data bus to the selected memory die. Therefore, the read data latency of the MCP RDIMM is three (3) clock cycles greater than an unbuffered DRAM device (non-MCP, un-buffered DIMM) and two (2) clock cycles greater than a conventional (non-MCP) RDIMM. As far as the write data latency of the MCP RDIMM 601 is concerned, it is one (1) clock cycle greater than an unbuffered DRAM device (non-MCP, un-buffered DIMM) and identical to that of a conventional (non-MCP) RDIMM.

In the above MCP RDIMM system, the addition of the register chip 610 reduces the loading on the memory controller 650 as far as the external control bus is concerned. Moreover, each MCP 600A, 600B, . . . , 600H presents only a single load as far as the external control bus and the external data bus are concerned. As a result, a greater number of MCPs can be accommodated (and thus a greater memory density can be achieved), while the frequency of operation can be maximized. In addition, power consumption will be lower, and higher termination resistance values can be used due to the reduced per-module loading. Also, it will be appreciated that the MCP RDIMM described above uses a smaller module board area than a conventional RDIMM of even half the capacity. This allows a lower module height and a more compact system, which is particularly beneficial in portable devices and blade servers where small form factor is a key requirement.

Thus, it will be appreciated that an MCP having a controller die to buffer both control signals and data signals to multiple memory die has been provided. The memory die and the controller die can be assembled into a stack. The controller die presents a single load to the external memory controller for high performance while reducing power consumption. Specifically, power reductions are achieved by providing separate internal data (and possibly also control) busses to individual memory die and only activating those busses connected to active memory devices. Power consumption is also reduced by operating the internal data and control busses in un-terminated mode. Additional power reductions are realized by operating the memory die in DLL-disabled mode. Further power reductions are achieved by employing VTT termination (rather than split termination) on the external data and control busses.

It should be appreciated that in some embodiments, all or part of the semiconductor memory device can be manufactured based on a low-level hardware description obtained using a logic synthesis tool that is run on a computing device. The logic synthesis tool is configured to read source code containing a functional description of the semiconductor memory device (e.g., in a language such as HDL, VHDL, Verilog) and to output a definition of the physical implementation of a circuit suitable for implementing corresponding functionality.

Additionally, although the above description has been provided in the context of a DRAM memory device, those skilled in the art may find that aspects of the invention apply to other memory types, including SRAM, MRAM, FeRAM, PCRAM, ReRAM, EEPROM, NAND Flash and NOR Flash memory.

In the embodiments described above, the device elements and circuits are shown as connected to each other for the sake of simplicity. In practical applications of the present invention, elements, circuits, etc. may be either connected directly to one another, or they may be connected indirectly to one another through other elements, circuits, etc., necessary for operation of devices and apparatus. Thus, in an actual configuration, the circuit elements and circuits described herein may be directly or indirectly coupled with or connected to one another.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A semiconductor memory device, including:
   a plurality of memory die;
   a controller die connected to an internal control bus, the controller die being configured to provide a selected one of the memory die with an internal read command in response to an external read command, the controller die comprising a master delay locked loop (DLL) to reference an internal clock signal to a global clock signal;
   wherein the selected memory die is configured to provide read data to the controller die in response to the internal read command;
   wherein a first latency between receipt by the controller die of the internal read command and receipt by the controller die of the read data from the selected memory die differs for at least two of the memory dies, the first latency differing depending on which of the at least two dies is selected as the selected memory die;
   the controller die being further configured to output the received read data onto an external data bus, wherein a second latency between receipt by the controller die of the external read command and output of the read data onto the external data bus is uniform for said at least two o the memory dies when selected as the selected memory die.

2. The device of claim 1, the controller die further configured to add an equalizing delay to the received read data after receipt from the selected memory die.

3. The device of claim 2, wherein said latency between receipt by the controller die of the external read command and output of the read data onto the external data bus, which is uniform for said at least two of the memory dies, is a total overall latency, and wherein the equalizing delay is selected so as to ensure that the total overall latency is a deterministic number of clock cycles.

4. The device of claim 1, the controller configured to select a first one of the memory dies as the selected memory die, to receive first read data from the first memory die, to select a second one of the memory dies as the selected memory die, to receive second read data from the second memory die and to output the first read data and the second read data onto an external data bus.

5. The device of claim 4, wherein receipt of a terminal portion of the first read data occurs contemporaneously with receipt of an initial portion of the second read data and wherein the controller die is further configured to buffer at least said initial portion of the second read data so as to allow said initial portion of the second read data to be output onto the external data bus following said terminal portion of the first data.

6. The device of claim 4, wherein a gap exists between receipt of a terminal portion of the first read data and receipt of an initial portion of the second read data, and wherein the controller die is further configured to delay outputting of the first read data so as to allow said initial portion of the second data to gaplessly follow said terminal portion of the first data on the external data bus.

7. The device of claim 1, the memory dies including the selected memory die each including a respective internal data bus independently connecting the respective memory die to the controller die.

8. The device of claim 7, the selected memory configured to provide the read data to the controller die by outputting the read data onto the respective internal data bus.

9. The device of claim 8, the controller die further configured to disable the internal data bus of each of the memory die other than the selected memory die when receiving the read data output by the selected memory die.

10. The device of claim 1, wherein the selected memory die lacks circuitry configured for providing on-die termination of the internal data and control busses.

11. The device of claim 7, wherein the selected memory die includes circuitry configured for providing on-die termination of the internal data and control busses, but where said circuitry is disabled.

12. The device of claim 11, wherein the selected memory die is configured with the on-die termination switched off.

13. The device of claim 1, the controller die further configured to receive a global clock signal on an external control bus.

14. The device of claim 13, wherein the controller die re-synchronizes the read data received from the selected memory die with the global clock signal.

15. The device of claim 1, the controller die further configured to output the received read data onto an external data bus, wherein the external data bus and the internal data bus have the same width.

16. The device of claim 1, the controller die further configured to output the received read data onto an external data bus, wherein the external data bus and the internal data bus have a different width.

17. The device of claim 1, the controller die further configured to output the received read data onto an external data bus, wherein the internal data bus carries the read data from the selected memory die at a rate of N1 bits per second per conductor and wherein the external data bus carries the re-synchronized captured read data from the controller die at a rate of N2 bits per second per conductor, wherein N1 and N2 are the same.

18. The device of claim 1, the controller die further configured to output the received read data onto an external data bus, wherein the internal data bus carries the read data from the selected memory die at a rate of N1 bits per second per conductor and wherein the external data bus carries the re-synchronized captured read data from the controller die at a rate of N2 bits per second per conductor, wherein N1 and N2 are different.

19. The device of claim 1, the controller die further configured to output the received read data onto an external data bus, the controller die including termination circuitry configured for providing on-die termination of the external data and control busses.

20. The device of claim 19, wherein said termination circuitry includes split-termination resistors.

21. The device of claim 19, wherein said termination circuitry includes a single termination resistor coupled to a termination voltage source.

22. The device of claim 1, wherein the internal read command identifies an internal address within the selected memory die, the controller further configured to determine at least the internal address within the selected memory die on a basis of the read command.

23. The device of claim 22, wherein the external read command specifies a plurality of external address bits corresponding to the internal address within the selected memory die.

24. The device of claim 23, wherein the external read command further specifies a second plurality of external address bits identifying the selected memory die.

25. The device of claim 23, wherein the external read, command is accompanied by a signal identifying the selected memory die.

26. The device of claim 25, wherein the signal identifying the selected memory die includes a chip enable signal.

27. The device of claim 1, wherein the plurality of memory die are stacked.

28. The device of claim 1, wherein each of the plurality of memory die is a dynamic random access memory (DRAM) die.

29. The device of claim 7, the controller die further configured to provide an internal clock signal to the selected memory die along the respective internal control bus, the internal read command being synchronized with the internal clock signal.

30. The device defined in claim 29, the selected memory die further configured to source-synchronously output the read data onto the respective internal data bus in response to receipt of the internal read command from the controller die.

31. The device defined in claim 1, being operated in a double data rate (DDR) mode.

32. The device defined in claim 7, the internal control bus and each respective internal data bus being operated in an un-terminated mode.

33. The device defined in claim 1, the selected memory die further configured to asynchronously provide the read data to the controller die in response to the internal read command.

34. A multi-chip package including a plurality of semiconductor memory devices, each semiconductor memory device including:
a plurality of memory dies;
a controller die connected to an internal control bus, the controller die being configured to provide a selected one of the memory dies with an internal read command in response to an external read command, the controller die comprising a master delay locked loop (DLL) to reference an internal clock signal to a global clock signal;
wherein the selected memory die is configured to provide read data to the controller die in response to the internal read command;
wherein a first latency between sending the controller die of the internal read command and receipt by the controller die of the read data from the selected memory die differs for at least two of the memory dies, the first latency differing depending on which of the at least two dies is selected as the selected memory die;
the controller die being further configured to output the received data onto an external data bus, wherein a second latency between receipt by the controller die of the external read command and output of the read data onto the external data bus is uniform for said at least two of the memory dies when selected as the selected memory die.

35. A multi-chip package comprising a plurality of semiconductor memory devices, each semiconductor memory device including:
a plurality of memory dies;
a controller die connected to an internal control bus, the controller die being configured to provide a selected one of the memory dies with an internal read command in response to an external read command, the controller die comprising a master delay lock loop (DDL) to reference an internal clock signal to a global clock signal;

wherein the selected memory die is configured to provide read data to the controller die in response to the internal read command;

wherein a first latency between sending by the controller die of the internal read command and receipt by the controller die of the read data from the selected memory die differs for at least two of the memory dies, the first latency differing depending on which of the at least two dies is selected as the selected memory die, the controller die further configured to output the received data onto an external data bus, wherein a second latency between receipt by the controller die of the external read command and output of the read data onto the external data bus is uniform for said at least two of the memory dies when selected as the selected memory die, the plurality of devices mounted on a circuit board with an interface, the multi-chip package further comprising a register chip mounted on the circuit board, the register chip distributing the external control bus to each of the devices, the external data but of each of the devices being directly coupled to the interface, bypassing the register chip.

* * * * *